United States Patent
Riddle et al.

(10) Patent No.: US 7,443,894 B2
(45) Date of Patent: Oct. 28, 2008

(54) SYSTEM AND METHOD FOR LASER TEMPERATURE COMPENSATION

(75) Inventors: Alfred Riddle, Milpitas, CA (US); John Havard, Seattle, WA (US)

(73) Assignee: Finesse Solutions, LLC, Santa Clara, CA (US)

( * ) Notice: Subject to any disclaimer, the term of this patent is extended or adjusted under 35 U.S.C. 154(b) by 7 days.

(21) Appl. No.: 11/788,639

(22) Filed: Apr. 20, 2007

(65) Prior Publication Data

US 2008/0130695 A1  Jun. 5, 2008

Related U.S. Application Data

(60) Provisional application No. 60/872,749, filed on Dec. 4, 2006.

(51) Int. Cl.
 H01S 3/13 (2006.01)
 H01S 3/00 (2006.01)
 H01S 3/04 (2006.01)

(52) U.S. Cl. .................. 372/34; 372/29.015; 372/38.07

(58) Field of Classification Search ............ 372/34, 372/38.07, 29.015
See application file for complete search history.

(56) References Cited

U.S. PATENT DOCUMENTS

| 4,639,924 A | * | 1/1987 | Tsunekawa | .................. 372/33 |
| 4,710,631 A | * | 12/1987 | Aotsuka et al. | .......... 250/354.1 |
| 6,807,202 B1 | * | 10/2004 | Plamper et al. | .......... 372/29.02 |

* cited by examiner

*Primary Examiner*—Armando Rodriguez
(74) *Attorney, Agent, or Firm*—Herbert Burkard (57) ABSTRACT

A method for compensating for changes in output power or wavelength of an optical source with temperature. Many optical sources have power and/or wavelength variations with temperature which can be compensated by open- or closed-loop methods if a method of accurately measuring the optical source temperature is available. The voltage across a semiconductor junction varies with temperature. Measuring the optical source power or wavelength variation with temperature and tracking the voltage across the semiconductor junction provides a means for compensating an instrument for temperature induced optical output power or wavelength variations. An important field of application is optical density or turbidity measurements in cellular media.

6 Claims, 7 Drawing Sheets

SYSTEM AND METHOD FOR LASER TEMPERATURE COMPENSATION

CROSS REFERENCE TO RELATED APPLICATIONS

This application claims priority from co-pending, provisional application Ser. No. 60/872,749, filed Dec. 4, 2006.

FIELD OF THE INVENTION

The present invention relates generally to the field of solid state optical source (i.e., laser or LED) temperature compensation.

BACKGROUND OF THE INVENTION

Many optical instruments and devices require a known optical power or wavelength output which remains relatively constant even if the ambient temperature of the instrument changes. When optical sources have variations related to changes in the source temperature, then some method of monitoring the source optical power, wavelength, and/or temperature must be provided in order to maintain a desired optical power and/or wavelength output or to predict the optical output. For many optical sources the output power and/or output wavelength will vary with the source temperature. These variations can be compensated for by open- or closed-loop methods if a method of measuring the source temperature or the output power or wavelength is available. If temperature is measured it is normally important that the temperature measurement device be located as close to the optical source as possible so that the measured temperature accurately indicates the temperature of the optical source. Such proximity is often difficult or even impossible to achieve for small optical devices that are often pre-packaged. The present invention provides a method and apparatus by which the temperature of an optical source can be determined through the measurement of certain electrical parameters of the optical source. This method avoids the need to directly measure the temperature itself (i.e., by using a separate sensor) or the parameter being compensated (e.g., output power or wavelength). One important field of application of this invention is the measurement of optical density in cellular media in bioprocess applications. However, this invention is not limited to optical density measurements or biopharmaceutical applications and is pertinent to any application that requires a source of stable optical output power and/or wavelength over a temperature range.

One application of the present invention outside the biotech arena is in diode pumped solid state lasers. Semiconductor lasers are often employed as pump sources for solid state lasers. In this instance, the semiconductor lasers excite the rare earth ions to an excited state in order for laser action to occur. The absorption features of many rare earth doped crystals (e.g.: Nd:YAG, Nd:YVO4) are fairly narrow and require the semiconductor lasers to be temperature stabilized in order to tune their output spectrum to coincide with the rare earth crystal's absorption spectrum. Once the semiconductor laser's spectrum is tuned to the appropriate wavelength, the temperature typically is monitored using a thermistor and controlled through a feed-back loop in order to keep the output at the proper wavelength. The temperature could also be sensed using the invention disclosed herein.

Figure 1:
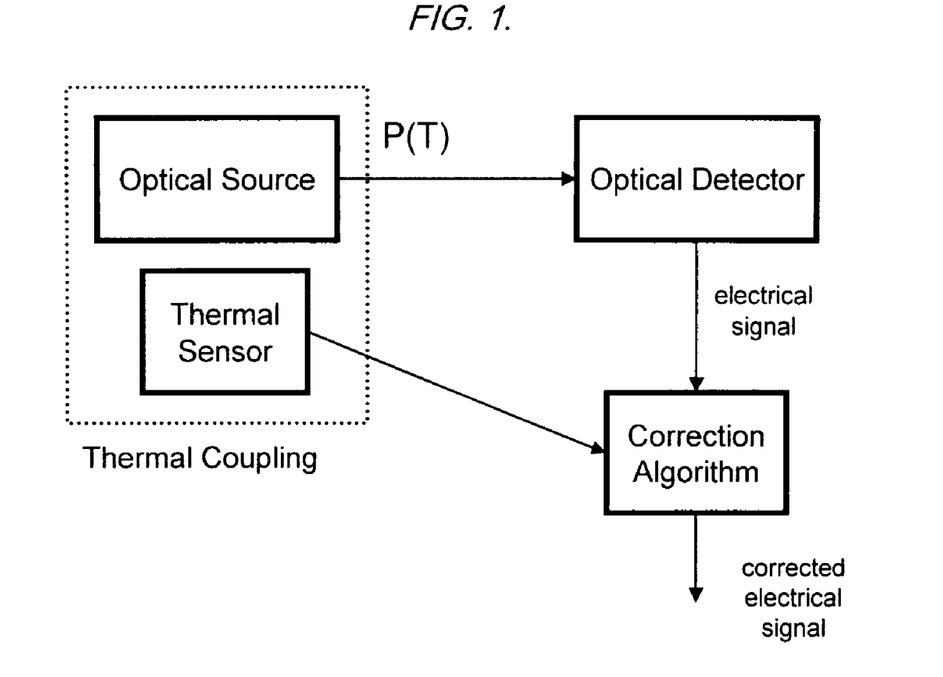
FIG. 1. A block diagram showing a method for open-loop thermistor temperature compensation of an optical power source.

FIG. 1 shows a block diagram of a prior art, open-loop power correction system based on using a thermistor or similar temperature sensing device to measure the optical source temperature and provide a correction factor for the optical power change with temperature [See U.S. Pat. No. 7,099,251; Maxim Application Note HFAN-09.2]. This method has relatively limited utility since it requires that both the thermistor properties and the optical source power variation with temperature be known.

Figure 2:
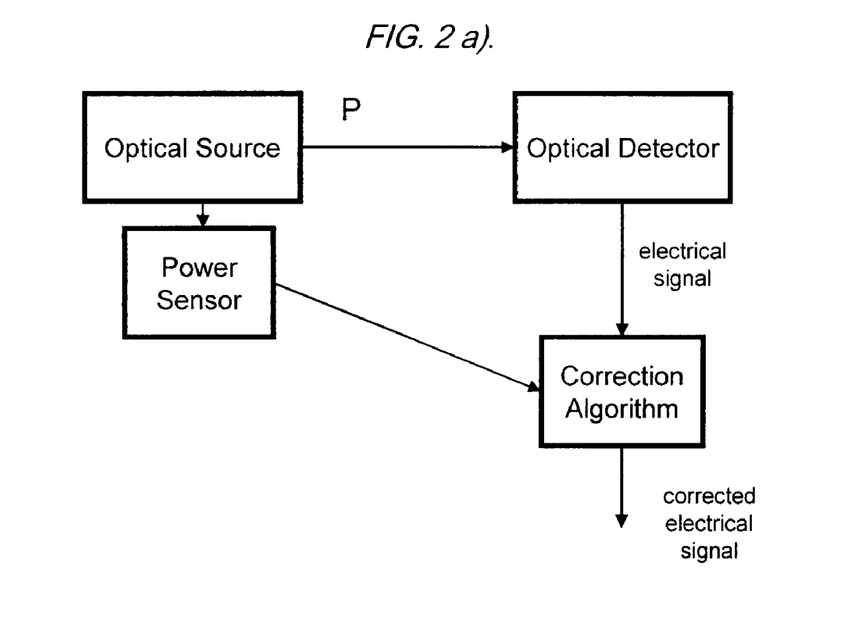

FIG. 2 shows another prior art method of optical power compensation. The optical power is measured directly and the compensation done as shown in either FIG. 2a) open loop, or FIG. 2b) closed loop [See Sipex Application Note SP8029; Maxim Application Note AN3080, Summit Microelectronics White Paper]. In general, closed loop compensation can be more accurate when the power measurement is accurate because all sources of power variation will be corrected.

Figure 3:
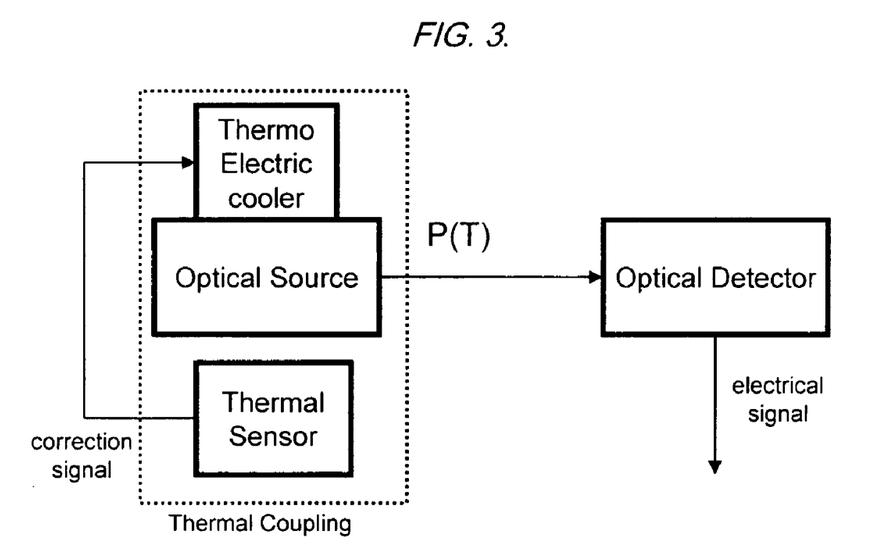
FIG. 3. Block diagram showing a method for closed-loop optical power compensation using a thermoelectric cooler.

FIG. 3 shows another prior art method of optical power correction. Thermal variations in the optical source are sensed and a feedback loop is created to a variable temperature source (typically a thermoelectric cooler "TEC") [See ILX Application Note #2, Linear Technology Application Note AN89-1]. The feedback loop allows the optical source to be held at a constant temperature so optical power output variations will not occur due to changes in source temperature.

However, directly monitoring the optical power or wavelength is often inconvenient, inaccurate, or both. Additionally, separate thermistors or similar temperature sensitive devices may be difficult or impractical to mount sufficiently proximate to the optical power source to provide an accurate reading of the source temperature. These facts, in conjunction with the fact that using a thermoelectric cooler is often impractical, leads to the need to sense the temperature of the optical source without requiring a separate sensor.

Figure 4:
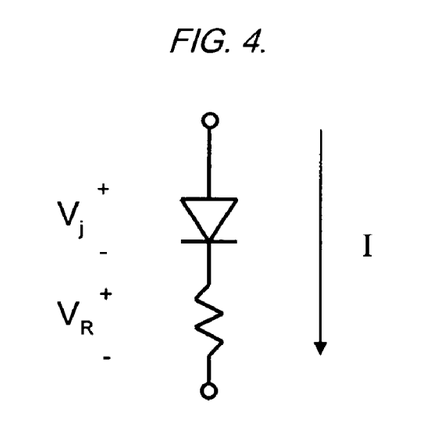
FIG. 4. A schematic illustrating semiconductor junction forward bias conditions (with resistance external to junction).

Semiconductor physics provides a direct relationship between temperature change and junction forward voltage drop. FIG. 4 shows a semiconductor diode junction with current and voltage indicated for forward bias conditions. The equation for the current through the junction is given by Equation (1). In Equation (1) I is the current through the junction, V is the voltage across the junction, $I_S$ is the junction saturation current, and $V_T$ is defined in Equation (3).

$$I=I_S(e^{V/V_T}-1) \qquad \text{Equation (1)}$$

A semiconductor diode also contains a finite resistance resulting from the ohmic contacts on the semiconductor and any wire length resistance from connections to the junction. Because the voltage drop across the resistance obeys Ohms law, namely V=I*R, the voltage drop across the entire device can be calculated. Voltage drops across the junction and the wire length resistance will be referred to as the "diode voltage drop". Voltage drop across just the junction will be referred to as the "junction voltage drop". For any practical operating temperature range (typically between 273 and 325 K), both these resistances can be considered to be independent of temperature.

Under forward bias conditions, where most optical sources (such as those used in a cell density monitor) will operate, the exponential term in Equation (1) dominates and one can write the junction forward bias voltage as shown in Equation (2).

$$V=V_T ln(I/I_S) \qquad \text{(Equation 2)}$$

Equation (2) shows that if I is held constant then the junction forward voltage is a function of $V_T$ and $I_S$. As $V_T$ increases the junction forward voltage increases and as $I_S$ increases the junction forward voltage decreases. Temperature changes in $V_T$ and $I_S$ will cause corresponding changes in V, so the temperature sensitivities of both $V_T$ and $I_S$ need to be understood.

The $V_T$ term in Equation (1) is defined in Equation (3).

$$V_T = nkT/q \quad \text{Equation (3)}$$

In Equation (3) n is the junction ideality factor (which is approximately unity), k is Boltzmann's constant, and T is the temperature in degrees Kelvin (See Sze, *Physics of Semiconductor Devices*, John Wiley & Sons, 1981, pp 63-132). From the definition of $V_T$ we see that $dV_T/dT$ is positive. By inspection Equation (3) also shows that an increase in temperature causes an increase in $V_T$.

The $I_S$ term in Equation (1) is defined in Equation (4).

$$I_S = BT^{3/2} e^{-E_g/nkT} \quad \text{Equation (4)}$$

In Equation (4), B is a physical constant of the particular semiconductor material, and $E_g$ is the band gap energy of the semiconductor material. By inserting Equations (3) and (4) into Equation (2) we get Equation (5).

$$V = \frac{nkT}{q}\ln\left(\frac{I}{BT^{3/2}}\right) + \frac{E_g}{q} \quad \text{Equation (5)}$$

For small changes in temperature, such as a ~20° C. variation about a mean temperature of 25° C., the constant term in Equation (5) can be ignored and the variation with forward junction voltage versus temperature will be approximated by Equation (6). For a temperature range of 10° C. to 50° C., Equation (6) reduces to approximately −2.3 mV/° C. for a silicon diode with an ideality factor of unity (Sze, op. cit. supra).

$$\frac{dV}{dT} \approx \frac{nk}{q}\ln\left(\frac{I}{BT^{3/2}}\right) \quad \text{Equation (6)}$$

Based on Equation (5), which embodies principles of semiconductor physics, we have ascertained that the voltage across the diode junction can serve as a very accurate indicator of relative temperature shift in an optical power source.

Although the use of the diode forward bias voltage has apparently previously been utilized for temperature compensation using a transistor proximate to the diode (See U.S. Pat. No. 5,397,933), using the diode forward bias voltage across an optical device as a direct indicator of the optical source's own temperature has not heretofore been applied to optical sources such as vertical cavity surface emitting lasers (VCSELs) or LEDs. Historically, temperature induced variations in the optical output power of semiconductor laser devices have been mitigated by using methods such as closed-loop correction involving direct measurement of the optical power, open-loop correction by using a separate temperature transducer near the optical device, or by a feedback system that controls the device temperature, e.g. a resistive temperature device (RTD) connected to a thermo-electric cooler. For instance, in the field of diode pumped solid state lasers, the laser is used to provide optical excitation energy for a rare earth ion doped host crystal. The rare earth ions typically have narrow absorption features, which require the laser diode pumps sources to be temperature stabilized, as the wavelength of emission and the power of the laser diodes changes as a function of temperature.

Figure 5:
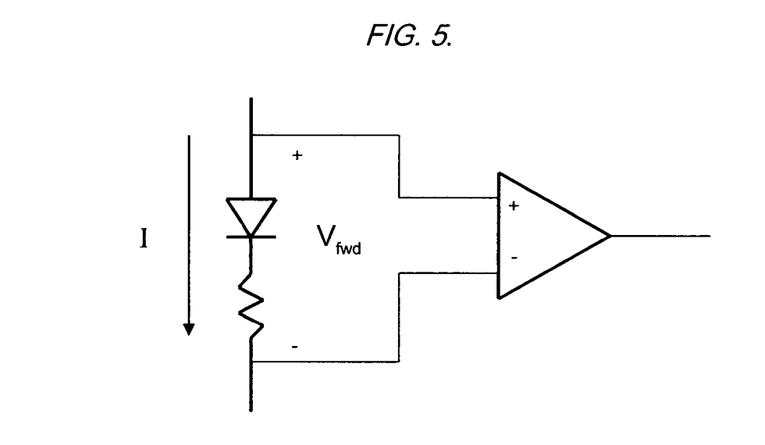
FIG. 5. shows a schematic of a differential amplifier circuit used to measure the voltage across a diode [Horowitz and Hill, The Art of Electronics, Cambridge University Press, 1980, pp. 176-185].

Our invention exploits the electrical response of a laser or LED itself to changes in its temperature, in order to compensate for changes in the optical output. By combining the principles of semiconductor physics with electrical measurements of the laser junction voltage, we have discovered that one can compensate for temperature variations in the optical power generation of the optical device. This ensures that the temperature measurement is closely correlated with the optical power source and minimizes the number of components required in a practical implementation. It is also important to measure the voltage across the diode accurately. FIG. 5 shows a prior art schematic of a differential amplifier used to measure the voltage across the diode [Horowitz and Hill, The Art of Electronics, Cambridge University Press, 1980, pp. 176-185].

Figure 6:
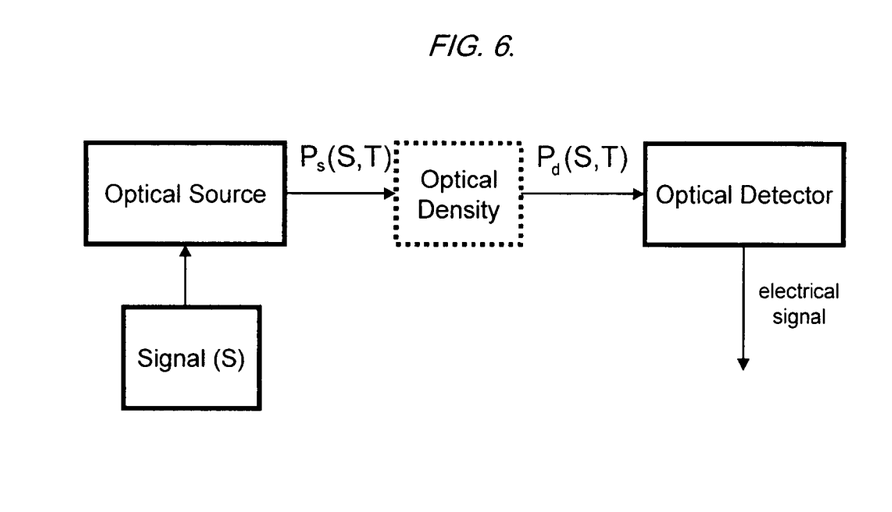
FIG. 6. A block diagram showing the method for optical density measurement.

Finally, it is important to note that the present invention applies, but is not limited, to the optical loss measurement shown in FIG. 6. However, a particularly advantageous use of the present invention does apply to the optical loss measurement as shown in FIG. 6. The optical source is driven by some input signal, typically current, and produces an output power which is primarily a function of the input signal and the ambient temperature $P_S(S,T)$. As the optical power travels through an optically dense sample medium the transmitted power measured by the photodetector is affected by one or more mechanisms such as absorption, scattering, or reflection in the sample medium. The result is a power at the detector, $P_d(S,T)$, which is less than or equal to the source power. An "absorbance unit" may be associated with the sample medium defined by "optical loss" or "optical density" such that the "absorbance unit" or AU is given by $\log_{10}(P_S/P_d)$.

BRIEF DESCRIPTION OF THE DRAWINGS

FIGS. 1 through 5 are illustrative of the prior art, while FIGS. 6 through 11 are illustrative of the present invention.

FIG. 2. Block diagrams showing method of: 2a) open- or 2b) closed-loop optical output power compensation using optical power measurement.

DETAILED DESCRIPTION OF THE INVENTION

As shown in FIG. 6, the optical semiconductor device, i.e. the laser or LED optical source is driven by an input signal, (normally current); and produces an output power $P_S$ which is primarily a function of the input signal and the ambient temperature (S,T). As the optical power travels through an optically dense sample medium the transmitted power, as measured by a photodetector, is affected by one or more mechanisms such as absorption, scattering, and/or reflection in the sample medium. The result is a power at the detector, $P_d$ which is less than, or (in the absence of absorption, scattering or reflection) equal to the source power. An "absorbance unit" may be associated with the sample medium defined by "optical loss" or "optical density" such that the "absorbance unit" or AU is given by $\log_{10}(P_S/P_d)$.

Figure 7:
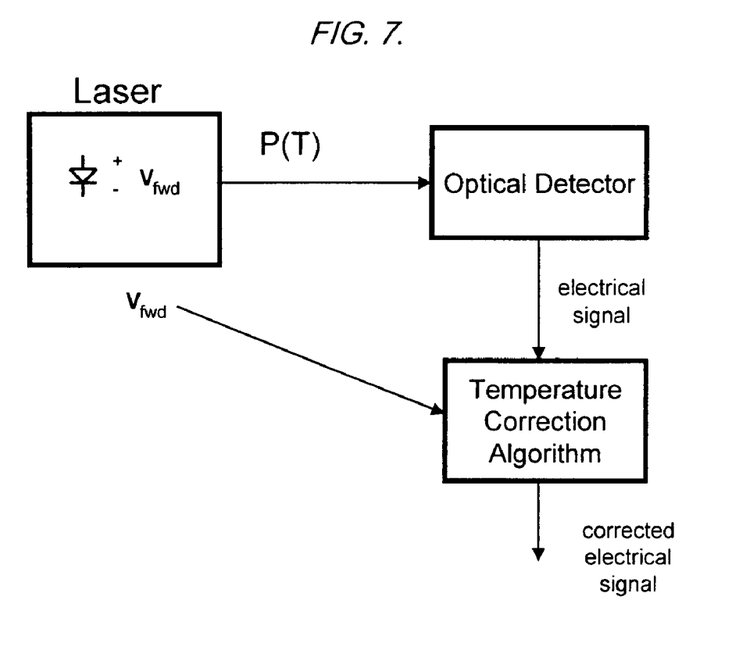
FIG. 7. A block diagram of open-loop optical output power compensation using the laser voltage as a temperature indicator.

The present invention uses the optical semiconductor device itself as a temperature sensor, as shown in FIG. 7. This approach ensures that the temperature of the optical device is tracked accurately. Semiconductor diodes, such as laser diodes and LEDs, have a forward bias voltage which varies with temperature in a known relationship. If the drive current to the diode is held constant then the only source of junction voltage variation is a change in temperature of the diode. Even in situations where the diode current changes, the diode temperature can still be determined by measuring the diode voltage, knowing the junction resistance, and subtracting current times the resistance from the diode voltage to thereby calculate the junction voltage.

Figure 9:
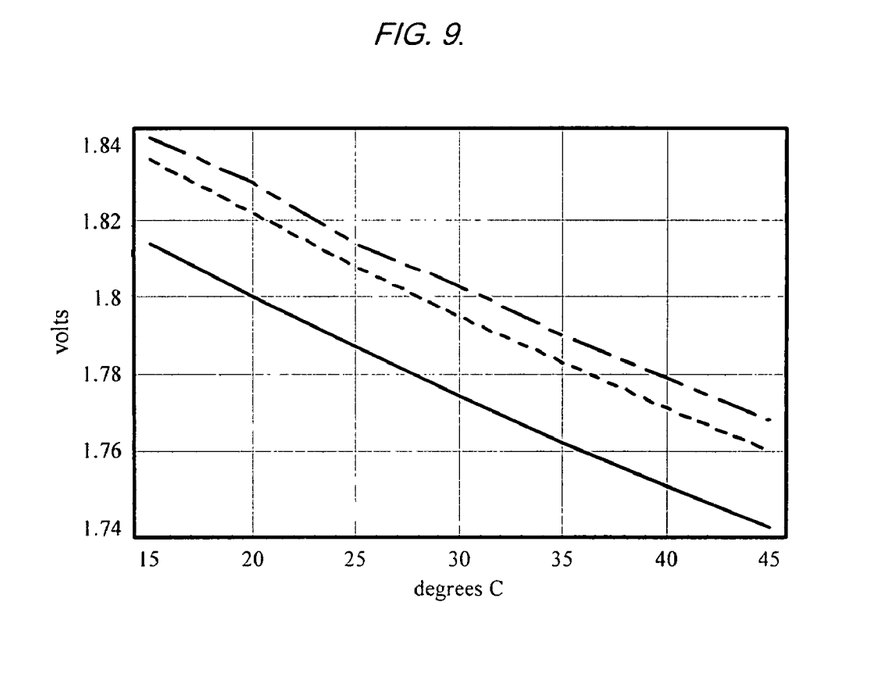
FIG. 9. Graph showing laser diode forward voltage versus temperature.
Figure 10:
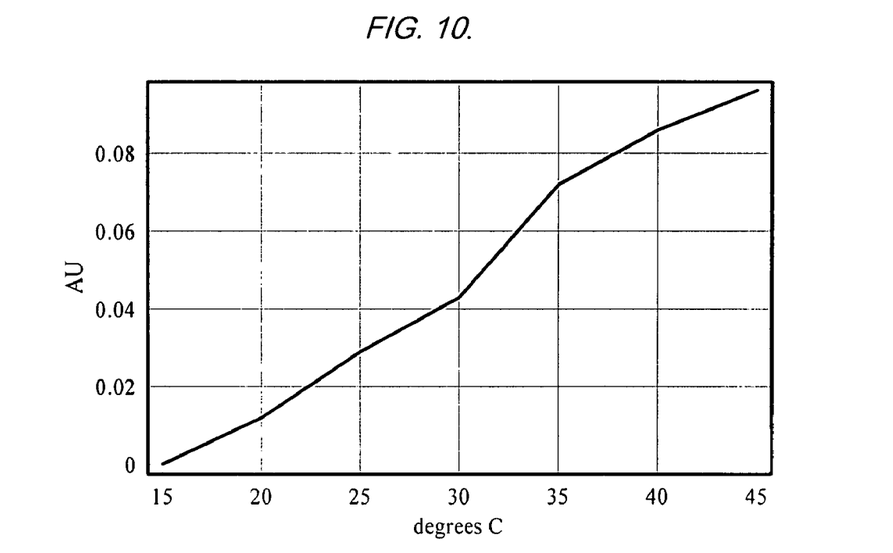
FIG. 10. Graph showing laser optical power output change (in AUs) versus temperature.
Figure 11:
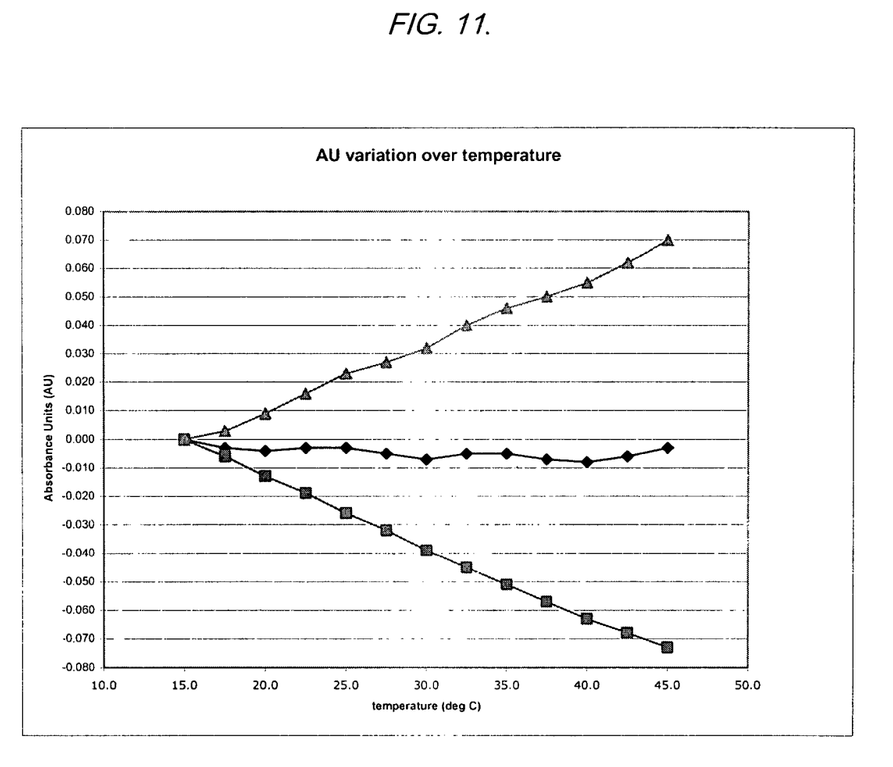
FIG. 11. Graph showing temperature correction to the measured transmission loss is obtained by application of the present invention to a VCSEL laser. Upper line is the uncorrected AU reading, while the lower line is the calculated correction factor, and the middle line is the corrected AU reading.

In the present invention temperature compensation requires knowing the diode voltage versus temperature sensitivity of the laser or LED as supplied by the manufacturer, measured as shown in FIG. 9. The three laser samples as shown in FIG. 9 have an average temperature dependence of $-2.5$ mV/°C. within a temperature range of 15 to 45°C. Any laser whose temperature coefficient is known can be used. According to this invention, the second step in temperature compensation is knowing the optical power versus temperature sensitivity of the laser as supplied by the manufacturer, as measured as shown in FIG. 10 or as calculated. FIG. 10 shows the relative optical output power reported in absorbance units or AU. FIGS. 9 and 10 combine to create the temperature correction algorithm (in AU/V) block diagram as shown in FIG. 7. A power correction performed on a completed device is shown in FIG. 11. FIG. 11 shows the uncorrected AU change with temperature, and the results of correcting the AU reading using the method described in the present invention.

A suitable power correction algorithm combines the laser forward voltage change with temperature, $C_L$, with the fractional laser power degradation with temperature, $E_L$, to create an AU correction factor, $AU_{corr}$, given by Equation (7). In Equation (7) $\Delta V_{fwd}$ is the relative voltage change experienced by the laser from the established reference voltage.

$$AU_{corr} = \log_{10}\left(1 + \Delta V_{fwd}\frac{E_L}{C_L}\right) \quad \text{Equation (7)}$$

If values for a given laser are $-0.0025$V/°C. for $C_L$ and $-0.5\%$/°C. for $E_L$, and if small variations in the forward voltage are assumed, then one can apply the approximation that $\ln(1+x) \approx x$. Since $\log_{10}(1+x) = \ln(1+x)/\ln(10)$, it follows that $\log_{10}(1+x) \cong x/2.303$. From this we arrive at a calculated correction of 0.87 AU/V which substantially corresponds to what we have found experimentally. Note that $E_L$ is converted from a percentage to a fraction by dividing by 100 before inserting into Equation (7).

Figure 8:
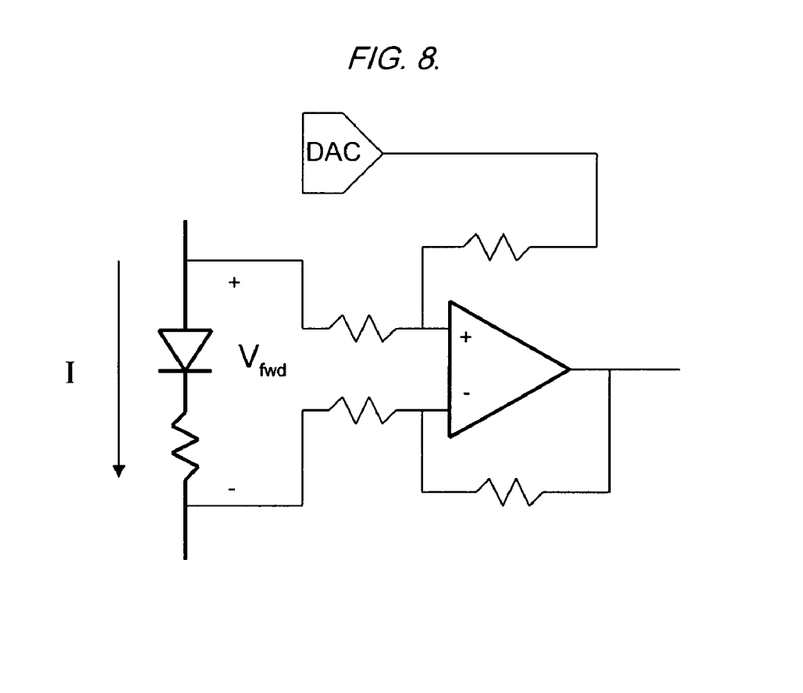
FIG. 8. Schematic showing an improved circuit for voltage referencing and measurement of junction voltage.

It is desirable to measure the diode voltage as accurately as possible. By having a reference voltage for the differential amplifier of FIG. 5, the sensitivity of the amplifier output to small changes in the diode forward voltage can be increased while at the same time minimizing the introduction of noise or other errors. FIG. 8 shows one circuit in accordance with the present invention using a digital-to-analog converter (DAC) to set the reference voltage for the differential amplifier. Other stable references, familiar to those skilled in the art (e.g., series or shunt voltage reference integrated circuits or precision voltage reference instrumentation) can also be used. The primary consideration here is that the amplifier output is now proportional not only to $V_{fwd}$, but is proportional to $V_{fwd} + V_{DAC}$ so the DAC, or any other reference, can be used to offset most of $V_{fwd}$. For example, $V_{fwd}$ may be 2V, while changes on the order of 50 mV are of interest. Having $V_{DAC}$ offset all but 50 mV of $V_{fwd}$ allows increased differential gain while remaining in the typical input range of an analog to digital converter.

The temperature measurement utilized in the practice of the present invention can be either relative or absolute. For relative measurements the diode voltage is stored as a reference and deviations from the diode reference voltage can be directly translated to relative temperature changes in the diode as long as the diode current is held constant. If the diode current is not held constant then a second correction can be applied using the diode IV curve, the known diode resistance external to the junction, and the deviation of the diode current from the diode current at the reference time (as shown in FIG. 4). For absolute temperature correction a reference temperature, must also be recorded at the time the diode reference voltage is stored such as in a look-up table. As described previously, if the diode current also changes then a correction factor based on the diode IV curve can be applied to account for the deviation of the diode current from the reference current.

What is claimed is:

1. A method for laser or LED temperature compensation using the forward voltage drop of the laser diode or LED for temperature sensing by creating the correction factor $AU_{corr}$ said method comprising the steps of:

i) determining the diode forward voltage versus temperature sensitivity of the laser or LED;

ii) determining the optical power versus temperature sensitivity of the laser or LED; and iii) creating a compensation algorithm in accordance with the equation:

$$AU_{corr} = \log_{10}\left(1 + \Delta V_{fwd}\frac{E_L}{C_L}\right)$$

wherein $C_L$ is the laser forward voltage change with temperature, $E_L$ is the fractional laser power degradation with temperature factor, and $\Delta V_{fwd}$ is the relative voltage change experienced by the laser from an established reference voltage.

2. The method of claim 1 wherein the laser is a semiconductor diode laser, a distributed feedback (DFB) laser, a vertical cavity semiconductor emitting laser (VCSEL) or a Fabry-Perot diode laser.

3. A method in accordance with claim 1 including the step of measuring the voltage across the optical diode power source using a differential amplifier.

4. A method in accordance with claim 3 comprising the additional step of providing a reference voltage to said differential amplifier.

5. A method in accordance with claim 1 wherein the diode current is held constant.

6. A method in accordance with claim 1 wherein the diode current is held constant and a correction factor based on the IV characteristics of the diode is applied.

* * * * *